United States Patent [19]

van Heyningen

[11] Patent Number: 5,126,666

[45] Date of Patent: Jun. 30, 1992

[54] METHOD AND APPARATUS FOR SUBSTANTIALLY ELIMINATING MAGNETIC FIELD INTERFERENCE TO A MAGNETOMETER CAUSED BY DC CURRENT CARRYING CONDUCTORS

[75] Inventor: Arent H. K. van Heyningen, Newport, R.I.

[73] Assignee: KVH Industries, Inc., Middletown, R.I.

[21] Appl. No.: 607,890

[22] Filed: Nov. 1, 1990

[51] Int. Cl.⁵ .......................................... G01R 33/025
[52] U.S. Cl. ..................................... 324/244; 324/262; 307/147; 174/32
[58] Field of Search .................. 324/225, 244–262, 324/207.12, 226, 227; 174/32, 33, 34, 35 R, 35 CE, 36; 307/91, 89, 147, 148, 491, 309; 333/12

[56] References Cited

U.S. PATENT DOCUMENTS

| | | | |
|---|---|---|---|
| 3,619,655 | 11/1971 | Cunningham | 333/12 |
| 4,056,790 | 11/1977 | Pospischil et al. | 333/12 X |
| 4,504,696 | 3/1985 | Piper | 174/32 |
| 4,506,235 | 3/1985 | Mayer | 333/12 |
| 4,739,262 | 4/1988 | Fleetwood | 324/244 X |
| 4,808,923 | 2/1989 | Posseme | 324/244 X |
| 5,015,953 | 5/1991 | Ferguson et al. | 324/244 |

Primary Examiner—Kenneth A. Wieder
Assistant Examiner—Warren S. Edmonds
Attorney, Agent, or Firm—Wolf, Greenfield & Sacks

[57] ABSTRACT

A method and apparatus for conducting DC current in the vicinity of a magnetometer without magnetic field interference thereto. The conductor in the area of the magnetometer is in the form of a plurality of twisted line pairs which are braided or otherwise intertwined to form a generally tubular-shaped construct which is preferably cylindrical. First and second equipotential surfaces are provided on each end of the construct with potential differences which are equal and opposite being applied between the first and second pair of surfaces, respectively. A first line of each twisted pair is connected between the first equipotential surfaces and the other line of each twisted pair is connected between the second equipotential surfaces, resulting in substantial equal and opposite DC currents flowing in the lines of each twisted pair. The magnetometer is positioned within the twisted pair construct, preferably near the center thereof. The effect is a substantially zero magnetic field in the area of the magnetometer.

14 Claims, 1 Drawing Sheet

METHOD AND APPARATUS FOR SUBSTANTIALLY ELIMINATING MAGNETIC FIELD INTERFERENCE TO A MAGNETOMETER CAUSED BY DC CURRENT CARRYING CONDUCTORS

FIELD OF THE INVENTION

This invention relates to reducing magnetic field interference and more particularly to a method and apparatus for substantially eliminating the magnetic field interference to a magnetometer caused by DC current conducting leads in the vicinity thereof.

BACKGROUND OF THE INVENTION

Magnetometers (i.e. magnetic field detectors) are utilized in a number of applications including applications for detecting the earth's magnetic field, and in particular the direction thereof. One such application is in long multi-element towed acoustic arrays utilized for submarine detection or other types of marine detection where the orientation of the acoustic detectors must be accurately established in order for optimum sensitivity to be achieved. A plurality of magnetometers spaced along the array are utilized to perform this function.

However, as the signal processing equipment utilized with magnetometers becomes more sophisticated, even relatively small errors in magnetometer readings become significant. For example, in a towed array application, accuracy in the detection of the direction of the earth's magnetic field to one tenth of a degree, or even one hundredth of a degree, may be desirable.

However, in an application such as the towed array application previously described, it is necessary to provide a significant amount of DC current to various components through wires which pass relatively close to the magnetometers. The magnetic field caused by this current flow in the area of the magnetometer causes unacceptable errors in the readings therefrom and thus in the attitude detection for the array.

A need therefore exists for a relatively simple and inexpensive method and apparatus to permit a magnetometer to be utilized in the vicinity of DC current carrying conductors without the magnetic field of such conductors adversely affecting the accuracy of the magnetometer output.

One prior proposal for achieving this objective was to utilize coaxial conductors, the central conductor carrying current in one direction and the concentrically positioned outer conductor carrying an equal and opposite current. Such an arrangement does not result in the creation of an external magnetic field. However, the coaxial conductor approach does not provide satisfactory results in applications such as for a towed array for a number of reasons. First, the space in such arrays is limited. Since the center conductor of the coaxial cable cannot be made arbitrarily small without unacceptable power losses due to resistance of the cable, a coaxial conductor is not an ideal solution to the magnetic interference problem in many applications. A more serious problem is that perfect coaxial cables are a mathematical concept, and while elimination of external magnetic fields can be approached using coaxial cables, the elimination of these fields using coaxial cables cannot generally be achieved. This is particularly true in a towed array situation where the array is flexing in use and is also stowed on a drum. This requires considerable flexibility of the coaxial cable and generally requires that the outer shield of the coaxial cable be braided from fine wires touching each other. This causes current distribution through the shield to not be perfectly uniform, resulting in less than total cancellation of external magnetic fields. Therefore, such cables will show small residues of magnetic field from place to place along the cable and from time to time.

SUMMARY OF THE INVENTION

It is, therefore, an object of this invention to provide for substantially total cancellation of the external magnetic field from a DC current carrying conductor which is in the vicinity of a magnetometer so as to eliminate magnetic interference and provide high accuracy outputs from the magnetometer.

In accordance with the above, this invention provides a method and apparatus for conducting DC current in the vicinity of a magnetometer without magnetic field interference thereto which involves a plurality of twisted line pairs. The twisted line pairs are braided together or otherwise intertwined and formed into a tubular shaped construct which is preferably cylindrical. First and second equipotential surfaces are provided at each end of the cylinder. A potential difference is applied between the first pair of surfaces and between the second pair of surfaces, which potential differences are substantially equal and opposite. A first line of each twisted pair is connected between the first equipotential surfaces and the other line of each twisted pair is connected between the second equipotential surfaces. This results in substantially equal and opposite DC currents flowing in the lines of each twisted pair. The magnetometer is positioned within the braided twisted pair tube or cylinder, preferably near the center thereof. The braiding of the twisted pairs is preferably both clockwise and counterclockwise. The braided tubes and magnetometer may be part of an elongated array having a plurality of spaced magnetometers and including a braided twisted pair tube in which each of the magnetometers is positioned. The cylinders are electrically connected by electrically connecting the corresponding equipotential surfaces of adjacent cylinders.

The foregoing and other objects, features and advantages of the invention will be apparent from the following more particular description of a preferred embodiment of the invention as illustrated in the accompanying drawings.

IN THE DRAWINGS

DETAILED DESCRIPTION

Figure 1:
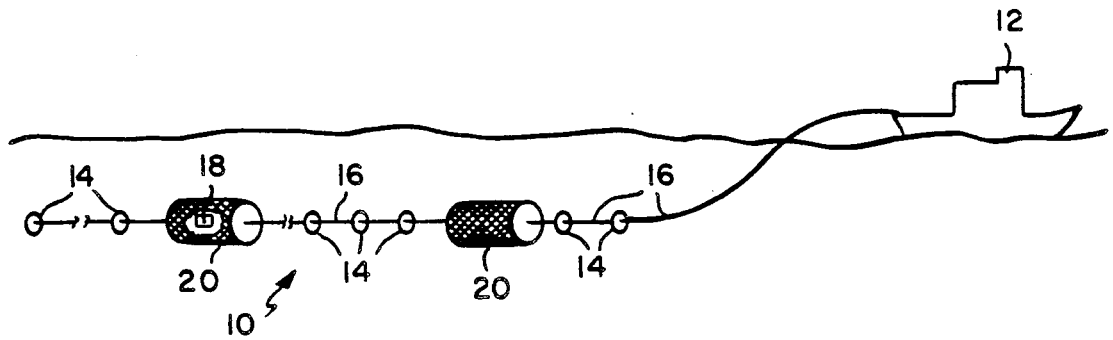
FIG. 1 is a partially broken away diagram illustrating a towed array utilizing apparatus in accordance with the teachings of this invention.

FIG. 1 illustrates a towed array of the type which may be used for submarine or other marine detection applications. The array 10 is shown being towed from a boat 12. The array consists of a plurality of hydrophones 14 or other sound detecting apparatus which are spaced along the array. The hydrophones 14 are connected by suitable electrical wiring 16. An array 10 might typically be in the area of a mile long and might have as many as 200 hydrophones spaced along the array In order to accurately establish the directional orientation of the hydrophones 14, and thus improve the accuracy of readings taken therefrom, a plurality of magnetometers 18 are mounted in wiring 16 at spaced intervals therealong. For this application, magnetometers 18 are adapted to detect the direction of the earth s magnetic field and thus function as compasses. As will be discussed in greater detail later, each magnetometer 18 is enclosed within a braided wire tube or cylinder 20, with one of the cylinders 20 being shown partially broken away in FIG. 1 so that the magnetometer 18 positioned therein is visible. For the mile long towed array described above, six (6) magnetometers 18 may be provided.

Figure 2:
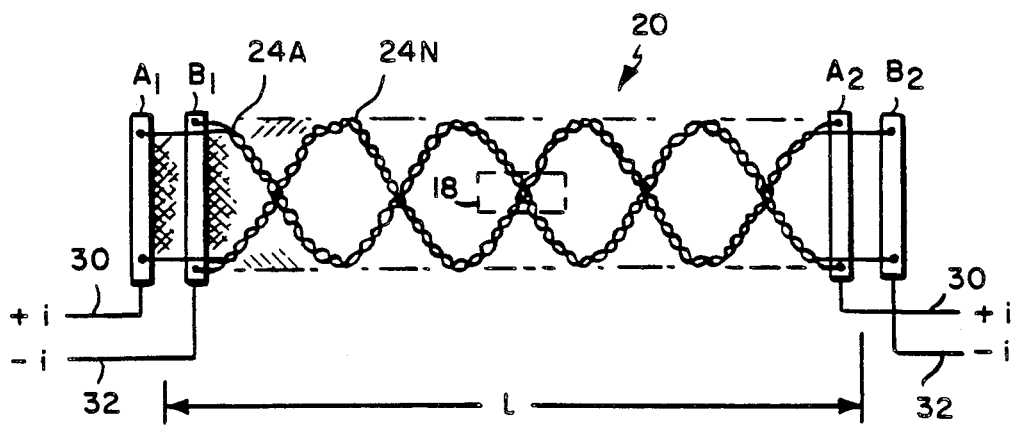
FIG. 2 is a broken away view of a single conductor apparatus in accordance with the teachings of this invention.
Figure 3:
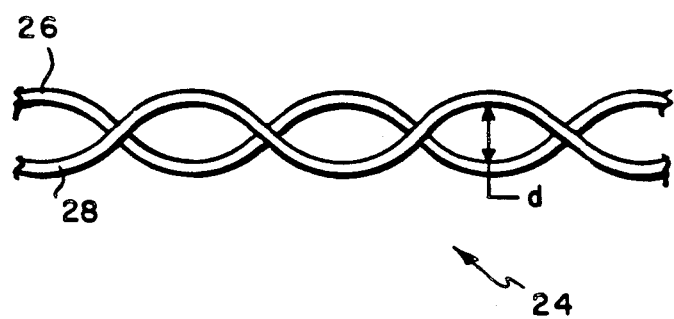
FIG. 3 is an illustration of a single twisted pair suitable for use in the embodiment of FIG. 2.

The wiring or lines 16 may include both AC and DC lines. The AC lines in the vicinity of the magnetometer, which, for example, may convey information to or from hydrophones 14 or magnetometers 18, do not generate a net external magnetic field and do not adversely affect magnetometer's accuracy provided that their frequency is at least an order of magnitude higher than the compass data averaging time; however, any DC current carrying lines which pass adjacent a magnetometer 18, which lines, for example, may provide reference potentials or power to various components, will generate an external magnetic field which may adversely affect magnetometer accuracy. FIGS. 2 and 3 illustrate a technique for the DC wiring in the area of magnetometers 18 so as to substantially eliminate the external magnetic field created thereby, and thus prevent the current flowing in such DC lines from adversely affecting magnetometer output.

From FIG. 2, it is seen that each cylinder 20 is formed of a plurality of twisted wire pairs 24A-24N with the twisted pairs being braided together, preferably both clockwise and counterclockwise in the manner of a Chinese finger puzzle, to form the cylinder 20. From FIG. 3, it can be seen that each twisted pair 24 consists of two wires 26 and 28, each of which is insulated so that the two conducting wires do not touch. The space "d" between the centers of the two wires of each twisted pair is a function both of wire gauge and insulation thickness and of how tightly the wires are twisted.

The lead 26 of each twisted pair 24 is connected between a pair of conductive rings A1 and A2, and the lead 28 of each twisted pair is connected between conductive rings B1 and B2. The cross section of the conductive rings is selected so that, for all intents and purposes, the rings can be considered as equipotential surfaces. Positive current lines 30 which are part of the lines 16 are connected to rings A1 and A2, resulting in a positive current flowing through line 26 of each twisted pair 24. An equal and opposite return negative current is applied through lines 32 to the rings B1 and B2, resulting in a negative current flowing through line 28 of each twisted pair which is equal and opposite to the current flowing in the corresponding line 26. For the preferred embodiment, all of the twisted pairs are identical so that the total current is evenly distributed among all pairs. The total resistance of all the twisted pairs 24 in parallel should be substantially the same as the equivalent length L of conductor 30, 32; however, the resistance of a single pair 24 should be high relative to the effective ring resistance to assure even current distribution among the pairs. In a typical application, there might be 36 twisted pairs 24 braided together to form cylinder 20. A greater or lesser number of twisted pairs may be desirable in some applications. Magnetometer 18 is preferably positioned at or near the center of cylinder 20 as shown in FIG. 1 and by the dotted box 18 in FIG. 2.

The rings A and B would typically be of copper or some other conductive material and would preferably have a diameter as large as practical while still fitting inside a plastic sleeve surrounding the array. A typical diameter might be from one to three inches. The exact diameter of the rings and of the cylinder will vary depending on the size of the magnetometer and other factors. The wires 26 and 28 of each twisted pair would be relatively small, for example, 30 or 35 gauge. The length L between rings A1 and B1 on one side of cylinder 20 and rings A2 and B2 on the other side of the cylinder might vary depending on factors such as the size of the magnetometer 18, the current in lines 30 and 32 and the resulting magnetic fields. Generally, the length of each cylinder 20 would be sufficient so that magnetic interference from lines 30 and 32 does no affect the magnetometer in the cylinder. A typical length might be approximately one yard. While not shown in the figures, such arrays are typically built in sections and completely enclosed in a protective plastic sleeve or tube reinforced with a low stretch material such as Kevlar TM. The thin-walled nature of the cylinders 20 permits them to function as a thin-walled, flexible tube readily following the bending of the array.

The elimination of the magnetic field by us of the construction shown in FIGS. 2 and 3 results from the fact that, as is known in the art, when two insulated parallel conductors are carrying equal and opposite currents, the magnetic field from the two conductors tend to cancel. The closer the centers of the parallel conductors get to each other, the greater the cancellation and the smaller the resulting magnetic field. The cancellation is further enhanced when the conductors are twisted together, the amount of the twist further reducing the stray field because of the field polarity changes caused by the twist. The above indicates that a tight twist is preferable, as are thin conductors with minimal insulation.

In addition, residual magnetic fields are directly proportional to the current being carried in the twisted wires. Therefore, by providing a large number of twisted pairs in the cylinder 20 in the area of the magnetometer, with each twisted pair carrying an equal small fraction of the total current, residual magnetic fields are even further reduced. In order to assure that the function of the total current carried by each twisted pair are uniform or equal, it is important that:

a) The DC resistance of each pair be large compared to the resistance of lines 16.
b) The resistance between the twisted pairs 24 should be matched.
c) The twisted pairs should terminate at each end in the conductive rings A1, A2, B1, B2 whose DC resistance is at least an order of magnitude smaller than the combined resistance of all pairs in parallel. It can be shown mathematically that the value of the contour integral taken over the twisted pairs distributed around a circle approaches zero as the number of twisted pairs gets large.

Thus, the magnetic interference from the current carrying conductors 26 and 28 can be reduced to any desired level by utilizing the structure of this invention by controlling the distance "d" between conductors, and in particular making this distance as small as possible, and by controlling the number of twisted pairs employed in cylinder 20. It has been found that this magnetic field can be reduced to a level where its effect on the magnetometer is in the range of 1/10th degree to 1/100th of a degree for a precision magnetometer.

While the invention has been particularly shown and described above with reference to a towed array implementation, it is apparent that the teachings of this invention could also be employed in other situations where a magnetic field sensing device is to be utilized in the presence of DC current carrying wires and the external magnetic field from such wires would cause unacceptable errors in the magnetometer outputs. Further, while for the preferred embodiment the twisted pairs are braided together, to form cylinder 20, braiding is done at least in part because of the ready availability of braiding equipment. It is possible in some applications that some other form of intertwining of the twisted pairs might be desirable. The wire tubes 20 have also been indicated as being generally cylindrical for the preferred embodiment since this, among other things, maximizes the space for the magnetometer. However, this is not a limitation on the invention, and other tubular shapes might be employed. The sizes, the wires, number of twisted pairs and the sizes of the rings and cylinders are also for purposes of illustration and may vary with application. Finally, the rings utilized to form the equipotential surfaces may also be replaced with other suitable elements for performing such function.

Thus, while the invention has been particularly shown and described above with reference to a preferred embodiment, the foregoing and other changes in form and detail may be made therein by one skilled in the art without departing from the spirit and scope of the invention.

What is claimed is:

1. Apparatus for conducting DC current in the vicinity of a magnetometer without causing magnetic field interference thereto comprising:
   a plurality of twisted line pairs, said twisted pairs being intertwined and formed into a tubular shaped construct, said magnetometer being positioned within the tubular construct;
   first equipotential surfaces at each end of the construct, said first equipotential surfaces having a first potential difference therebetween, second equipotential surfaces at each end of the construct, said second equipotential surfaces having a second potential difference therebetween, said first and second potential differences being substantially equal and opposite; and
   means for connecting a first line of each twisted pair between the first equipotential surfaces and the other line of each twisted pair between the second equipotential surfaces.

2. Apparatus as claimed in claim 1 wherein said equipotential surfaces are conductive rings.

3. Apparatus as claimed in claim 1 wherein the apparatus and magnetometer are part of an elongated array having a plurality of spaced magnetometers, and including a tubular construct in which each of said magnetometers is positioned, and means for electrically connecting corresponding equipotential surfaces.

4. Apparatus as claimed in claim 1 wherein said magnetometer is positioned substantially at the center of the tubular construct.

5. Apparatus as claimed in claim 1 wherein the number of said twisted pairs is approximately 36.

6. Apparatus as claimed in claim 1 wherein said twisted pairs are intertwined by being braided together.

7. Apparatus according to claim 6 wherein the braiding of said twisted pairs is both clockwise and counterclockwise.

8. Apparatus as claimed in claim 1 wherein the tubular construct has a generally cylindrical shape.

9. A method for forming a DC current conductor which may be utilized in the vicinity of a magnetometer without causing magnetic field interference thereto comprising the steps of:
   forming a plurality of electrical lines into a plurality of twisted line pairs;
   intertwining said twisted pairs together in the form of a tubular twisted pair construct;
   providing first equipotential surfaces at each end of the construct;
   providing second equipotential surfaces at each end of the construct;
   applying a first potential difference between said first equipotential surfaces and a second potential difference between said second equipotential surfaces which first and second potential differences are equal and opposite;
   connecting a first line of each twisted pair between the first equipotential surfaces and the other line of each twisted pair between the second equipotential surfaces, whereby substantially equal and opposite DC currents flow in the lines of each twisted pair; and
   positioning the magnetometer within the construct.

10. A method as claimed in claim 9 wherein said magnetometer is positioned substantially at the center of the construct.

11. A method as claimed in claim 9 wherein the number of said twisted pairs is approximately 36.

12. A method as claimed in claim 9 wherein said intertwining step includes the step of braiding said twisted pairs together.

13. A method as claimed in claim 12 wherein the braiding step includes the step of braiding twisted pairs both clockwise and counterclockwise.

14. A method as claimed in claim 9 wherein said tubular construct is formed in a generally cylindrical shape.

* * * * *